US006146914A

United States Patent [19]

Burke et al.

[11] Patent Number: 6,146,914

[45] Date of Patent: Nov. 14, 2000

[54] THERMAL INK JET PRINTHEAD WITH INCREASED HEATER RESISTOR CONTROL

[75] Inventors: Cathie J. Burke, Rochester; Alan D. Raisanen, Sodus; Sean D. O'Brien, Victor, all of N.Y.

[73] Assignee: Xerox Corporation, Stamford, Conn.

[21] Appl. No.: 09/207,071

[22] Filed: Dec. 7, 1998

[51] Int. Cl.[7] .......... H01L 21/00

[52] U.S. Cl. .......... 438/21; 257/380; 257/379; 347/62; 347/65

[58] Field of Search .......... 438/21; 347/12, 347/62, 65, 59, 40; 257/380, 379

[56] References Cited

U.S. PATENT DOCUMENTS

| | | | |
|---|---|---|---|
| 4,947,192 | 8/1990 | Hawkins et al. | 346/140 R |
| 5,639,386 | 6/1997 | Burke et al. | 216/27 |
| 5,706,041 | 1/1998 | Kubby | 347/65 |
| 5,742,307 | 4/1998 | Watrobski et al. | 347/62 |
| 5,751,315 | 5/1998 | Burke et al. | 347/63 |
| 5,969,392 | 8/1999 | Hawkins et al. | 257/380 |

*Primary Examiner*—Matthew Smith
*Assistant Examiner*—V. Yavisikov

[57] ABSTRACT

An improved method is disclosed for forming heater elements for an ink jet printhead. The resistance is more closely controlled by doping a central heater region which is formed relatively thinner than the heavily doped heater regions which are used as the gate and contact areas. The thinner central region can doped relatively heavy in order to more accurately adjust the heater resistance.

In another embodiment, the thin layer is amorphous silicon rather than the polysilicon to increase the latitude of the energy input.

5 Claims, 3 Drawing Sheets

THERMAL INK JET PRINTHEAD WITH INCREASED HEATER RESISTOR CONTROL

BACKGROUND OF THE INVENTION AND MATERIAL DISCLOSURE STATEMENT

The present invention relates to thermal ink jet printers, and more particularly, to printheads incorporating a plurality of heater resistors which are selectively addressed to heat and expel ink from adjacent ink channels.

Thermal ink jet printing utilizes printheads which use thermal energy to produce vapor bubbles in ink-filled channels to expel ink droplets. A thermal energy generator or heater element, usually a resistor, is located at a predetermined distance from a nozzle of each one of the channels. The resistors are individually addressed with an electrical pulse to generate heat which is transferred from the resistor to the ink.

The transferred heat causes the ink to be super heated, i.e., far above the ink's normal boiling point. For example, a water based ink reaches a critical temperature of 280° C. for bubble nucleation. The nucleated bubble or water vapor thermally isolates the ink from the heater element to prevent further transfer of heat from the resistor to the ink. Further, the nucleating bubble expands until all of the heat stored in the ink in excess of the normal boiling point diffuses away or is used to convert liquid to vapor which, of course, removes heat due to heat of vaporization. During the expansion of the vapor bubble, the ink bulges from the nozzle and is contained by the surface tension of the ink as a meniscus.

When the excess heat is removed from the ink, the vapor bubble collapses on the resistor, because the heat generating current is no longer applied to the resistor. As the bubble begins to collapse, the ink still in the channel between the nozzle and bubble starts to move towards the collapsing bubble, causing a volumetric contraction of the ink at the nozzle and resulting in the separating of the bulging ink as an ink droplet. The acceleration of the ink out of the nozzle while the bubble is growing provides the momentum and velocity to expel the ink droplet towards a recording medium, such as paper, in a substantially straight-line direction. The entire bubble expansion and collapse cycle takes about 20 microseconds ($\mu$s). The channel can be refired after 100 to 500 $\mu$s minimum dwell time to enable the channel to be refilled and to enable the dynamic refilling factors to be somewhat dampened.

To eject an ink droplet, each heater element must become hot enough to cause the ink to reach a bubble nucleation temperature of at least 280° C. for water based ink. In order for the heater element to generate the thermal energy to cause bubble nucleation, an operating voltage is applied to a resistor of the heater element. Typically, the operating voltage is proportional to the resistance of the resistor, i.e., the higher the resistance, the higher the operating voltage.

Conventionally, polysilicon is used to form the resistors of the heater elements. The resistance value of the resistors is chosen based on the actual required power ($Power=V\times I=I^2\times R=V^2/R$) for ejection of the ink droplet through bubble nucleation. Once the required power and voltage has been chosen, the resistance value is determined. The fabrication of the determined resistance is controlled by the sheet resistance (ohms/square; $\Omega/\square$) of the polysilicon and the size of the resistor. The size of the resistor can be tightly controlled by photolithography and polysilicon etch techniques. The sheet resistance of the polysilicon is primarily controlled by impurity doping, preferably by ion implantation, and annealing of the doped polysilicon.

As drop ejection becomes more efficient, the heater element size required decreases and the resistance required increases. The more resistive the heaters, the lower the doping level, and the more difficult it is to accurately control the resistance. When resistance is too high, threshold voltage is too high and drops are not ejected. When resistance is too low, threshold voltage is too low, and the extra voltage applied to the printhead results in excess heat, which causes ink to bake on the heater. This results in an extra insulting layer on the heater, decreasing energy transferred to the ink, creating smaller drops and eventually completely failing to eject drops. In addition, "over voltage" operation results in decreased heater lifetime. Conventional techniques use doping to introduce impurities in the polysilicon heater structure. One method disclosed in U.S. Pat. No. 5,639,386, whose contents are incorporated by reference, teaches methods of fabricating polysilicon resistors with improved threshold uniformity which includes steps for forming resistors with two doped regions, a lightly doped center region and more heavily doped end region. The heater element is formed on a polysilicon layer 8 (see FIG. 3 of the patent). N-type dopants, typically phosphorus, are ion implanted into the polysilicon layer to form a lightly doped heater center region. A photoresist layer 8 is patterned to protect the heater center region followed by heavier doping at the ends. This results in lightly doped center regions 8A and heavily doped end regions 8B. Regions 8B are heavily doped to make good electrical contacts to address leads and for low resistance to form transistor gates. The photoresist layer is removed, and the polysilicon is plasma etched to form the final resistor structure.

SUMMARY OF THE INVENTION

It is known that resistance of polysilicon is best controlled when the doping is kept high and the polysilicon layer thickness controlled. In the prior art, the polysilicon layer thickness, once chosen, is the same for the heater center region and the end regions.

According to a first aspect of the invention, a fabrication process is disclosed which allows a thick polysilicon layer to be used for the gate region and heater contact region while a thinner polysilicon layer forms the heater center region. The thickness of the center region can be adjusted more accurately to control the heater resistance. Thus, the heater resistance is controlled by adjusting the thickness of the heater element center region rather than by the lightly doped ion implantation technique of the prior art. The fabrication process improvement described is economically attractive, since this two-layer polysilicon process can be implemented with the same number of photolithographic mask levels as the conventional two-implant polysilicon resistor process.

According to a second aspect of the invention, amorphous silicon is used for the center region instead of polysilicon. In the prior art device referenced above, the deposition rate is too low to permit utilization of amorphous silicon. Amorphous silicon provides a smoother heater surface, which increases the latitude of the energy input, and in time, increases the yield process. By decreasing the thickness of the heater center region, amorphous silicon becomes a viable option.

More particularly, the present invention relates to a method for fabricating a heater element of a printhead, the method comprising the steps of:

(a) forming a resistor on a substrate, the resistor forming steps comprising:

(i) forming a first polysilicon layer on a substrate;

(ii) doping the polysilicon layer;

(iii) removing a central portion of said polysilicon layer to expose the surface of said substrate leaving two end regions of said first polysilicon layer;

(iv) forming a second layer of polysilicon which is relatively thinner than said first polysilicon layer over said end regions and over said bare substrate surface to form a thin polysilicon central heater region;

(v) heavily doping the heater region and (vi) processing the heater element to form said two end regions of relatively high resistance polysilicon to function as gates and conductors.

DESCRIPTION OF THE INVENTION

Figure 1:
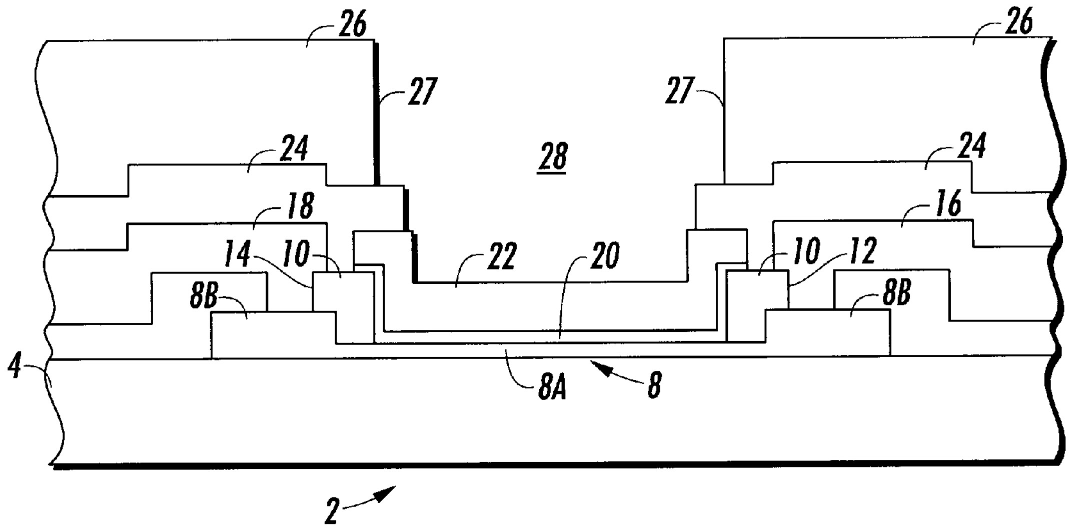
FIG. 1 is an enlarged cross-sectional view of a heater element according to the present invention.

FIG. 1 is an enlarged, cross-sectional view of a heater element 2 fabricated according to the invention. Although only one heater element is illustrated, heater elements of the printheads are generally produced in large arrays of several hundred elements. When all of the resistors of the heater elements are fabricated concurrently, they will have substantially uniform sheet resistance, and the resistances between individual resistors of the heater elements in a printhead and from printhead to printhead will be substantially uniform.

The heater element is formed by depositing polysilicon on top of substrate 4 and etching to form a resistor 8. The resistor 8 has a doped n-type region 8A which is thinner than two heavily doped n-type regions 8B formed at ends of region 8A. The process for forming regions 8A and 8B will be described below.

Phosphosilicate glass (PSG) is deposited and reflowed on top of the resistor 8 and etched to form the PSG step regions 10 which expose a top surface of the resistor 8 and electrode vias 12, 14 for the addressing and common return electrodes 16, 18. Further, the PSG step regions 10 define the effective heater area. A dielectric isolation layer 20, of silicon nitride or silicon dioxide, or a composite of both, is formed on top of the resistor 8 to electrically isolate the resistor 8 from the tantalum layer 22 and the ink. A tantalum (Ta) layer 22 is sputter deposited on the dielectric isolation layer 20 to protect the resistor 8 and the dielectric isolation layer 20 from the hot corrosive ink and cavitational pressures due to the collapsing bubble. The dielectric isolation and Ta layers 20, 22 are etched and aluminum (Al) is deposited and etched to form the addressing electrode 16 and common return electrode 18. For an overglaze passivation layer 24, a thick layer of CVD deposited phosphosilicate glass is deposited over the entire substrate and etched to expose the Ta layer 22. Finally, a thick insulating layer is deposited over the entire substrate and etched or photolithographically patterned to form the pit layer 26 and the pit 28.

The following describes the various methods and materials used to form the heater elements illustrated in FIG. 1.

Referring to FIGS. 2–6, the substrate 4 of the heater element is preferably formed of silicon. Silicon is preferably used so that heater driver electronics can be integrated on the print element. The substrate is (100) double side polished P-type silicon and has a thickness of 525 micrometers ($\mu$m). Further, the substrate 4 can be lightly doped, for example, to a resistivity of 10 ohm-cm, degenerately doped to a resistivity between 0.01 to 0.001 ohm-cm to allow for a current return path or degenerately doped with an epitaxial, lightly doped surface layer of 2 to 25 $\mu$m to allow fabrication of active field effect or bipolar transistors.

Polysilicon is deposited on top of substrate 4 by chemical vapor deposition (CVD) to a thickness of between 500 and 6,000 angstroms (Å) to form the resistor 8 and regions 8B. In the preferred embodiment, the resistor 8 has a thickness of between 4,000 and 5,000 Å, and preferably has a thickness of 4,500 Å.

Figure 2:
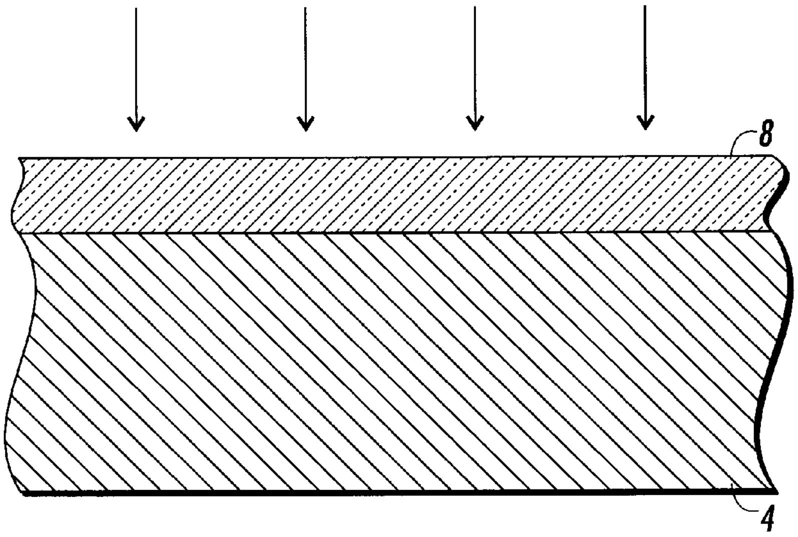
FIG. 2 is an enlarged cross-sectional view of a polysilicon layer of a heater element of FIG. 1 being heavily doped by ion implantation.
Figure 3:
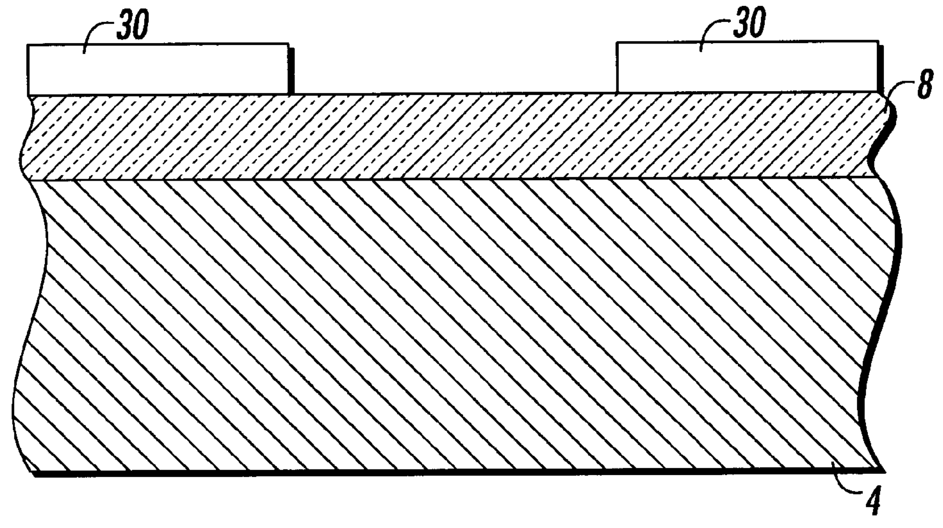
FIG. 3 shows the heater element of FIG. 2 with a photoresist pattern applied to the top surface of the polysilicon layer.
Figure 4:
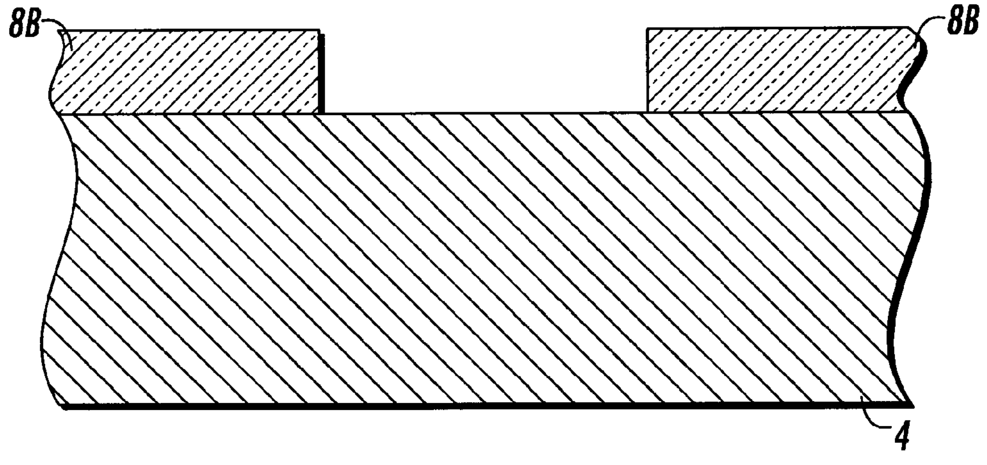
FIG. 4 shows the heater element of FIG. 3 with the center portion of the polysilicon layer etched to the base substrate.
Figure 5:
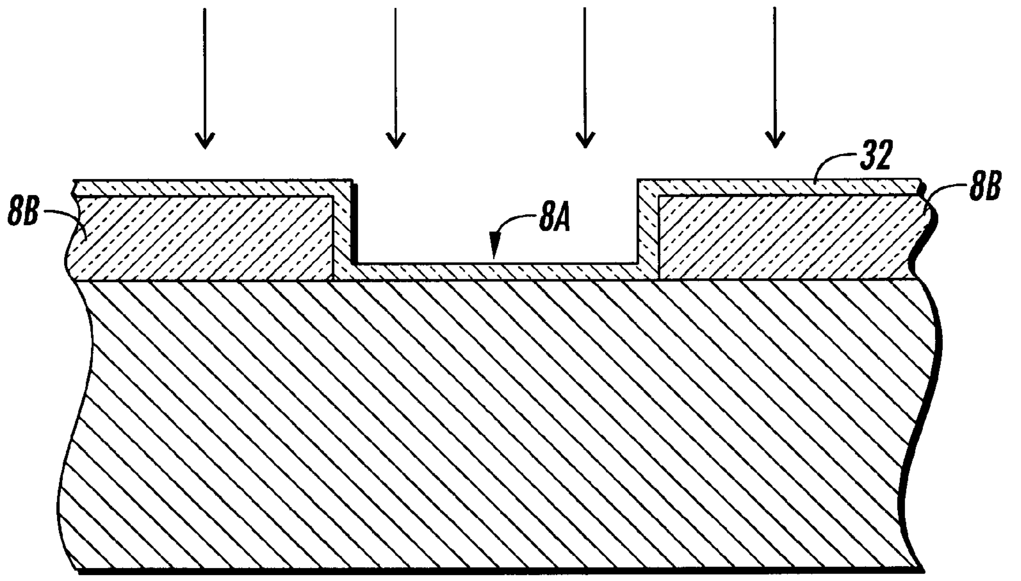
FIG. 5 shows the heater element of FIG. 4 following formation of a thinner doped polysilicon layer.
Figure 6:
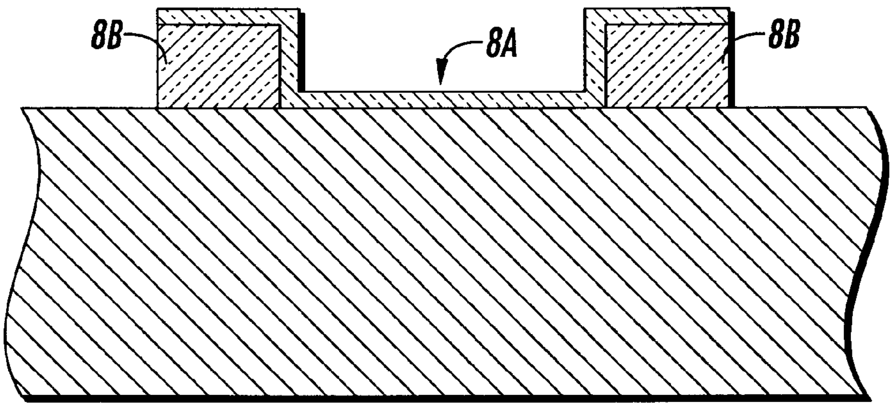
FIG. 6 shows the heat element of FIG. 5 following a patterning and etching step.

Layer 8 is heavily doped, implanted with a dose of about 1 E 16 $cm^{-2}$ at 70–100 KeV (FIG. 2). A photoresist layer 30 is applied (FIG. 3) to mask the end areas leaving an open rectangle which determines what will become center heater region 8A. A plasma or wet etch process is used to remove the polysilicon layer 8 from the heater center (FIG. 4). The polysilicon end regions 8B will be patterned to form the contacts and gates, which are heavily doped for low resistance. A second thin layer 32 of polysilicon is deposited over the first layer (FIG. 5) and over the bare coated regions overlying the substrate 4. Layer 32 is between 500 and 3000 Å thick and preferably 1000 Å thick. Regions 8A of layer 32 are doped to achieve the sheet resistance required for the particular drop ejector. Since layer 32 is thin, the doping level can be increased relative to prior art designs, as the sheet resistance at a given doping level varies inversely with thickness. Thus, increasing the resistivity of layer 8A by making it thin makes it possible to dope it at a level where resistance control is simplified. In some cases, it is possible to select a thickness for layer 8A such that the doping levels of layer 8A and the heater ends 8B are the same, making it possible to implant both layers at the same time. The entire polysilicon layer is then patterned and etched (FIG. 6) to form a thin, relatively high resistance polysilicon center region 8A and thick low resistance polysilicon end regions 8B. Further processing to form the complete heater wafer is described in U.S. Pat. No. 5,639,386.

According to a second aspect of the invention, amorphous silicon is used for layers 8 and 30 rather than polysilicon. Amorphous silicon, when recrystallized, has a smaller grain structure and is smoother than polysilicon. Dopant atoms do not segregate at grain boundaries to the degree observed in polysilicon; therefore, doping will be more uniform and more reproducible. Since the deposition rate of amorphous silicon is very low relative to polysilicon, using a thin layer for the center region makes the use of amorphous silicon economically feasible.

While the embodiment disclosed herein is preferred, it will be appreciated from this teaching that various alternative, modifications, variations or improvements therein may be made by those skilled in the art, which are intended to be encompassed by the following claims.

What is claimed is:

1. A method for fabricating a heater element of a printhead, the method comprising the steps of:

(a) forming a resistor on a substrate, the resistor forming steps comprising:
   (i) forming a first polysilicon layer on a substrate;
   (ii) heavily doping the polysilicon layer;
   (iii) removing a central portion of said polysilicon layer to expose the surface of said substrate leaving two end regions of said first polysilicon layer;
   (iv) forming a second layer of polysilicon which is relatively thinner than said first polysilicon layer over said end regions and over said bare substrate surface to form a thin polysilicon central heater region;
   (v) doping the central heater region and
   (vi) processing the heater element to form said two end regions of relatively low resistance polysilicon to function as gates and conductors.

2. A method for fabricating a heater element of a printhead, the method comprising the steps of:

(a) forming a resistor on a substrate, the resistor forming steps comprising:
   (i) forming a polysilicon layer on a substrate;
   (ii) doping the polysilicon layer;
   (iii) removing a central portion of said polysilicon layer to expose the surface of said substrate leaving two end regions of said first polysilicon layer;
   (iv) forming a layer of amorphous silicon which is relatively thinner than said first polysilicon layer over said end regions and over said bare substrate surface to form a thin amorphous silicon central heater region;
   (v) doping the central heater region and
   (vi) processing the heater element to form said two end regions of relatively low resistance polysilicon to function as gates and conductors.

3. The method of claim 1 wherein said polysilicon layer is 4000 to 5000 Å thick and said polysilicon layer is between 500 and 3000 Å thick.

4. A method for fabricating a heater element of a printhead, the method comprising the steps of:

(a) forming a resistor on a substrate, the resistor forming steps comprising:
   (i) forming a polysilicon layer on a substrate;
   (ii) removing a central portion of said polysilicon layer to expose the surface of said substrate leaving two end regions of said first polysilicon layer;
   (iii) forming a layer of polysilicon which is relatively thinner than said first polysilicon layer over said end regions and over said bare substrate surface to form a thin polysilicon central heater region;
   (iv) doping both the thin central heater region and the thick end regions in a single doping step, and
   (v) processing the heater element to form said two end regions of relatively low resistance polysilicon to function as gates and conductors.

5. A method for fabricating a heater element of a printhead, the method comprising the steps of:

(a) forming a resistor on a substrate, the resistor forming steps comprising:
   (i) forming a polysilicon layer on a substrate;
   (ii) removing a central portion of said polysilicon layer to expose the surface of said substrate leaving two end regions of said first polysilicon layer;
   (iii) forming a layer of amorphous silicon which is relatively thinner than said first polysilicon layer over said end regions and over said bare substrate surface to form a thin amorphous silicon central heater region;
   (v) doping the amorphous central heater region polycrystalline heater end regions in a single doping step, and
   (vi) processing the heater element to form said two end regions of relatively low resistance polysilicon to function as gates and conductors.

* * * * *